United States Patent
Kim

(10) Patent No.: US 11,056,503 B2
(45) Date of Patent: Jul. 6, 2021

(54) SEMICONDUCTOR MEMORY DEVICE INCLUDING VERTICAL BARRIER

(71) Applicant: SK hynix Inc., Icheon-si (KR)

(72) Inventor: Jae Taek Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 44 days.

(21) Appl. No.: 16/580,817

(22) Filed: Sep. 24, 2019

(65) Prior Publication Data

US 2020/0273881 A1 Aug. 27, 2020

(30) Foreign Application Priority Data

Feb. 25, 2019 (KR) .................. 10-2019-0022063

(51) Int. Cl.

| | |
|---|---|
| *H01L 27/11582* | (2017.01) |
| *H01L 27/11573* | (2017.01) |
| *H01L 27/11565* | (2017.01) |
| *H01L 23/522* | (2006.01) |
| *H01L 27/11575* | (2017.01) |
| *H01L 23/528* | (2006.01) |

(52) U.S. Cl.
CPC ...... *H01L 27/11582* (2013.01); *H01L 23/528* (2013.01); *H01L 23/5226* (2013.01); *H01L 27/11565* (2013.01); *H01L 27/11573* (2013.01); *H01L 27/11575* (2013.01)

(58) Field of Classification Search
CPC ......... H01L 27/11582; H01L 27/11565; H01L 27/11573; H01L 27/11575; H01L 23/5226; H01L 23/528
See application file for complete search history.

(56) References Cited

U.S. PATENT DOCUMENTS

| | | | |
|---|---|---|---|
| 2011/0065270 A1* | 3/2011 | Shim ................ | H01L 27/11582 438/589 |
| 2011/0312174 A1* | 12/2011 | Lee .................... | H01L 27/11582 438/595 |
| 2013/0126957 A1* | 5/2013 | Higashitani ....... | H01L 27/11565 257/314 |
| 2017/0179026 A1* | 6/2017 | Toyama ............ | H01L 27/11573 |
| 2019/0043879 A1* | 2/2019 | Lu ..................... | H01L 23/535 |
| 2019/0057974 A1* | 2/2019 | Lu ..................... | H01L 27/11565 |

FOREIGN PATENT DOCUMENTS

| | | |
|---|---|---|
| KR | 1020130133566 A | 12/2013 |
| KR | 1020140112827 A | 9/2014 |
| KR | 1020180106727 A | 10/2018 |

\* cited by examiner

*Primary Examiner* — Lex H Malsawma

(74) *Attorney, Agent, or Firm* — William Park & Associates Ltd.

(57) ABSTRACT

A semiconductor memory device includes a dummy stack structure having a first stack structure and a second stack structure formed on the first stack structure. The semiconductor memory device also includes a cell stack structure surrounding the dummy stack structure. The semiconductor memory device further includes a vertical barrier disposed at a boundary between the cell stack structure and the dummy stack structure, the vertical barrier including a first part formed on a sidewall of the first stack structure and a second part formed on a sidewall of the second stack structure. A sectional area of the first part of the vertical barrier is greater than a sectional area of the second part of the vertical barrier at a height at which a boundary between the first stack structure and the second stack structure is disposed.

18 Claims, 17 Drawing Sheets

SEMICONDUCTOR MEMORY DEVICE INCLUDING VERTICAL BARRIER

CROSS-REFERENCE TO RELATED APPLICATION

The present application claims priority under 35 U.S.C. § 119(a) Korean patent application number 10-2019-0022063, filed on Feb. 25, 2019, in the Korean Intellectual Property Office, the entire disclosure of which is incorporated herein by reference.

BACKGROUND

1. Technical Field

The present disclosure generally relates to a semiconductor memory device and a manufacturing method thereof, and more particularly, to a manufacturing method of a three-dimensional semiconductor memory device.

2. Related Art

A semiconductor memory device includes memory cells capable of storing data. In order to improve the degree of integration of memory cells, a three-dimensional semiconductor memory device has been proposed.

The three-dimensional semiconductor memory device includes three-dimensionally arranged memory cells. The degree of the three-dimensional semiconductor memory device may be improved when the stacking number of memory cells is increased. However, structural instability increases with the stacking number of memory cells.

SUMMARY

In accordance with an aspect of the present disclosure, a semiconductor memory device includes a dummy stack structure including a first stack structure and a second stack structure formed on the first stack structure. The semiconductor memory device also includes a cell stack structure surrounding the dummy stack structure. The semiconductor memory device further includes a vertical barrier disposed at a boundary between the cell stack structure and the dummy stack structure. The vertical barrier includes a first part formed on a sidewall of the first stack structure and a second part formed on a sidewall of the second stack structure. A sectional area of the first part of the vertical barrier is greater than a sectional area of the second part of the vertical barrier at a height at which a boundary between the first stack structure and the second stack structure is disposed.

In accordance with another aspect of the present disclosure, a semiconductor memory device includes a source structure. The semiconductor memory device also includes a first source contact structure and a second source contact structure, each extending from the source structure. The semiconductor memory device further includes a dummy stack structure disposed between the first source contact structure and the second source contact structure, and includes a cell stack structure surrounding the dummy stack structure between the first source contact structure and the second source contact structure, the cell stack structure overlapping the source structure. The semiconductor memory device additionally includes a semiconductor pattern extending along a boundary between the dummy stack structure and the cell stack structure, the semiconductor pattern extending to the inside of the source structure. The semiconductor memory device also includes dielectric layers extending along an outer wall of the semiconductor pattern. The dielectric layers are separated from each other by the source structure.

BRIEF DESCRIPTION OF THE DRAWINGS

Example embodiments are described hereinafter with reference to the accompanying drawings. However, the example embodiments may be embodied in different forms and should not be construed as limiting the present teachings. A limited number of possible embodiments are presented so that this disclosure will be enabling for those skilled in the art.

In the drawing figures, dimensions may be exaggerated for clarity of illustration. Like reference numerals refer to like elements throughout.

DETAILED DESCRIPTION

Figure 1:
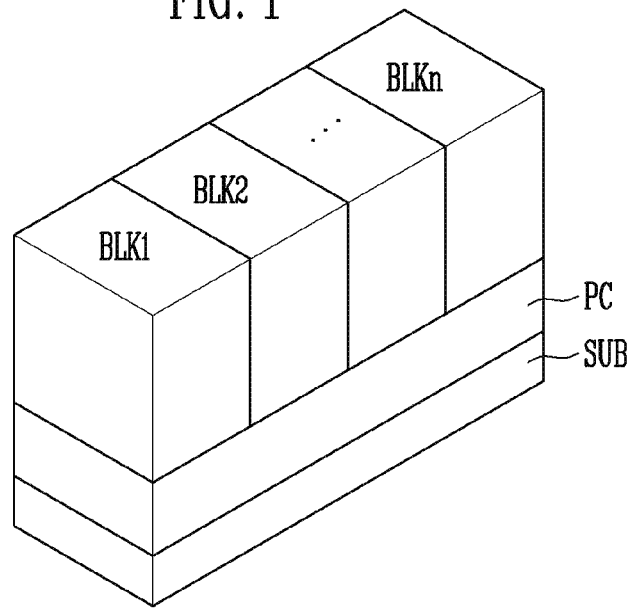
FIG. 1 is a block diagram schematically illustrating a semiconductor memory device in accordance with an embodiment of the present disclosure.

Specific structural or functional descriptions disclosed herein are merely illustrative for the purpose of describing embodiments according to the concept of the present disclosure. Embodiments can be implemented in various forms, thus, the present teachings should not be construed as being limited to the particular embodiments set forth herein.

Embodiments according to the present disclosure can be modified in various ways and have various shapes. Thus, the embodiments are illustrated in the drawings and are intended to be described herein in detail. However, the embodiments according to the present disclosure are not construed as limited to presented descriptions and illustrations, and include all changes, equivalents, or substitutes that do not depart from the spirit and technical scope of the present disclosure.

While terms such as "first" and "second" may be used to describe various components, such components must not be understood as being limited to the above terms. The above terms are used to distinguish one component from another, and are not meant, unless otherwise specified, to indicate an order or number of components. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element, or intervening elements may also be present. In contrast, when an element is referred to as being "directly connected" or "directly coupled" to another element, no intervening elements are present.

It will be understood that when an element is referred to as being "between" two elements, it can be the only element between the two elements, or one or more intervening elements may also be present.

The terms used in the present application are merely used to describe particular embodiments and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Embodiments provide for a semiconductor memory device with improved structural stability.

FIG. 1 is a block diagram schematically illustrating a semiconductor memory device in accordance with an embodiment of the present disclosure.

Referring to FIG. 1, the semiconductor memory device may include a peripheral circuit structure PC and memory blocks BLK1 to BLKn, which are disposed on a substrate SUB. The memory blocks BLK1 to BLKn may overlap the peripheral circuit structure PC.

The substrate SUB may be a single crystalline semiconductor layer. For example, the substrate SUB may be a bulk silicon substrate, a silicon-on-insulator (SOI) substrate, a germanium substrate, a germanium-on-insulator (GOI) substrate, a silicon-germanium substrate, or an epitaxial thin film formed through a selective epitaxial growth technique.

The peripheral circuit structure PC may include a row decoder, a column decoder, a page buffer, a control circuit, and the like, which constitute a circuit for controlling operations of the memory blocks BLK1 to BLKn. For example, the peripheral circuit structure PC may include an NMOS transistor, a PMOS transistor, a register, a capacitor, and the like, which are electrically connected to the memory blocks BLK1 to BLKn. The peripheral circuit structure PC may be disposed between the substrate SUB and the memory blocks BLK1 to BLKn.

Each of the memory blocks BLK1 to BLKn may include impurity doped regions, bit lines, cell strings electrically connected to the impurity doped regions and the bit lines, word lines electrically connected to the cell strings, and select lines electrically connected to the cell strings. Each of the cell strings may include memory cells and select transistors, which are connected in series by a channel structure. Each of the select lines is used as a gate electrode of a corresponding select transistor, and each of the word lines is used as a gate electrode of a corresponding memory cell.

In another embodiment, the substrate SUB, the peripheral circuit structure PC, and the memory blocks BLK1 to BLKn may be stacked in an inverse order with respect to the order shown in FIG. 1. The peripheral circuit structure PC may be disposed on the memory blocks BLK1 to BLKn.

Figure 2:
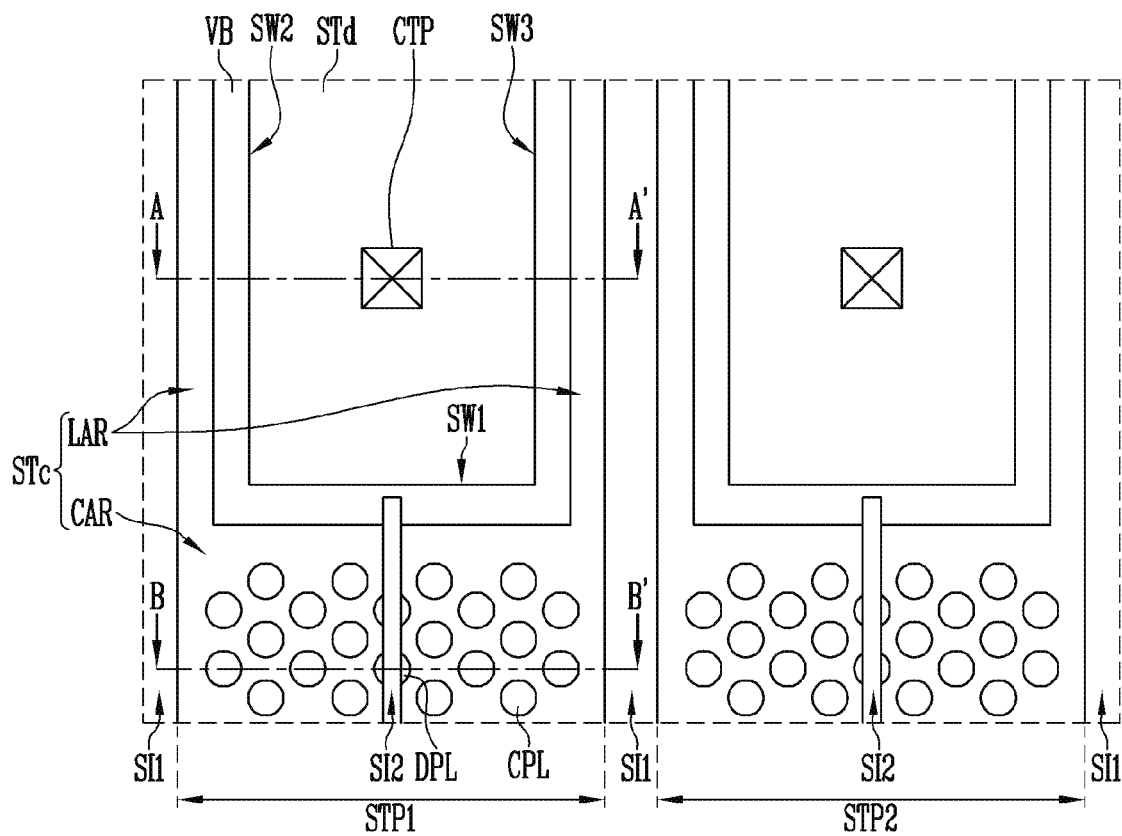
FIG. 2 is a plan view illustrating a memory block in accordance with an embodiment of the present disclosure.

FIG. 2 is a plan view illustrating a memory block in accordance with an embodiment of the present disclosure.

Referring to FIG. 2, at least one of stack patterns STP1 and STP2 separated from each other by first slits SI1 may constitute a memory block. In an embodiment, first and second stack patterns STP1 and STP2 shown in FIG. 2 may constitute first and second memory blocks BLK1 and BLK2 shown in FIG. 1, respectively. In another embodiment, the first and second stack patterns STP1 and STP2 may constitute one memory block. Embodiments of the present disclosure are not limited to this. For example, three or more stack patterns may constitute one memory block.

Each of the stack patterns STP1 and STP2 may include a dummy stack structure STd, a cell stack structure STc, and a vertical barrier VB. The cell stack structure STc may surround the dummy stack structure STd, and the vertical barrier VB may extend along a boundary between the cell stack structure STc and the dummy stack structure STd.

The cell stack structure STc may include a cell array region CAR and connection regions LAR. The cell array region CAR is a region in which cell strings are disposed. The cell array region CAR may be opposite to a first sidewall SW1 of the dummy stack structure STd intersecting the first slits SI1, and extend in parallel to the first slits SI1. The connection regions LAR may be respectively opposite to second and third sidewalls SW2 and SW3 of the dummy stack structure STd, which are opposite to the first slits SI1, and extend in parallel to the first slits SI1.

The cell array region CAR of the cell stack structure STc is penetrated by cell plugs CPL. Each of the cell plugs CPL constitutes a cell string corresponding thereto. The cell plugs CPL may be arranged in a matrix structure between adjacent first slits SI1, or be arranged in zigzag between adjacent first slits SI1. The cell plugs CPL may form a row along the extending direction of the first slits SI1. The cell plugs CPL may be arranged in a plurality of rows. The cell plugs CPL may be divided into different groups by a second slit SI2. The second slit SI2 may penetrate a portion of the cell array region CAR.

The second slit SI2 may extend toward the first sidewall SW1 of the dummy stack structure STd to be connected to the vertical barrier VB. The second slit SI2 may overlap dummy plugs DPL arranged along the second slit SI2. The dummy plugs DPL may be simultaneously formed with the cell plugs CPL.

The dummy stack structure STd may be penetrated by a contact plug CTP. The contact plug CTP is connected to the peripheral circuit structure PC shown in FIG. 1.

The process of forming the cell stack structure STc may include a process of introducing a conductive material through the first slits SI1. The vertical barrier VB may prevent the conductive material introduced through the first slits SI1 from being introduced into the dummy stack structure STd. The vertical barrier VB may be simultaneously formed with the cell plugs CPL. Accordingly, a manufacturing process can be simplified.

Figure 3A:
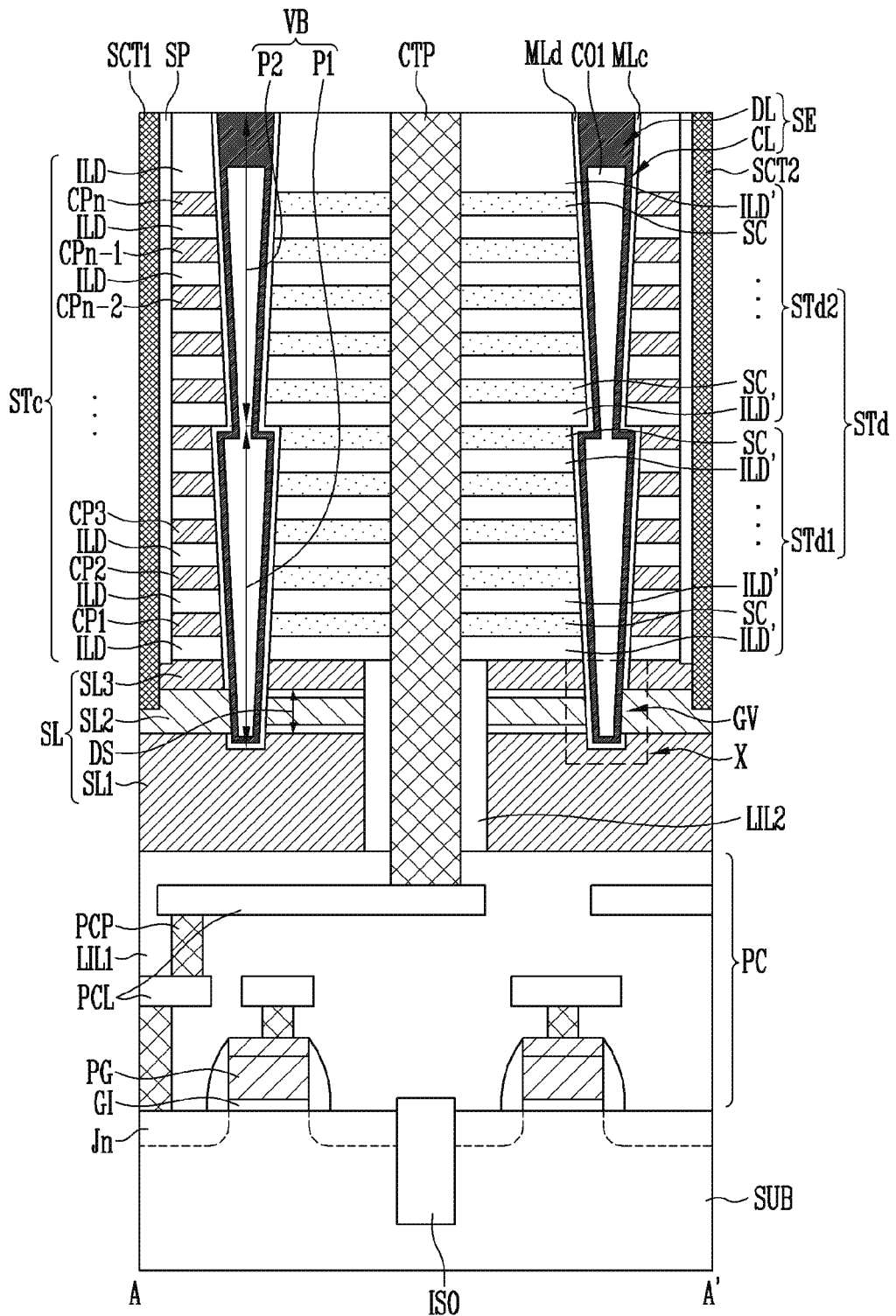
FIGS. 3A and 3B are sectional views of the semiconductor memory device taken along lines A-A' and B-B' shown in FIG. 2.
Figure 3B:
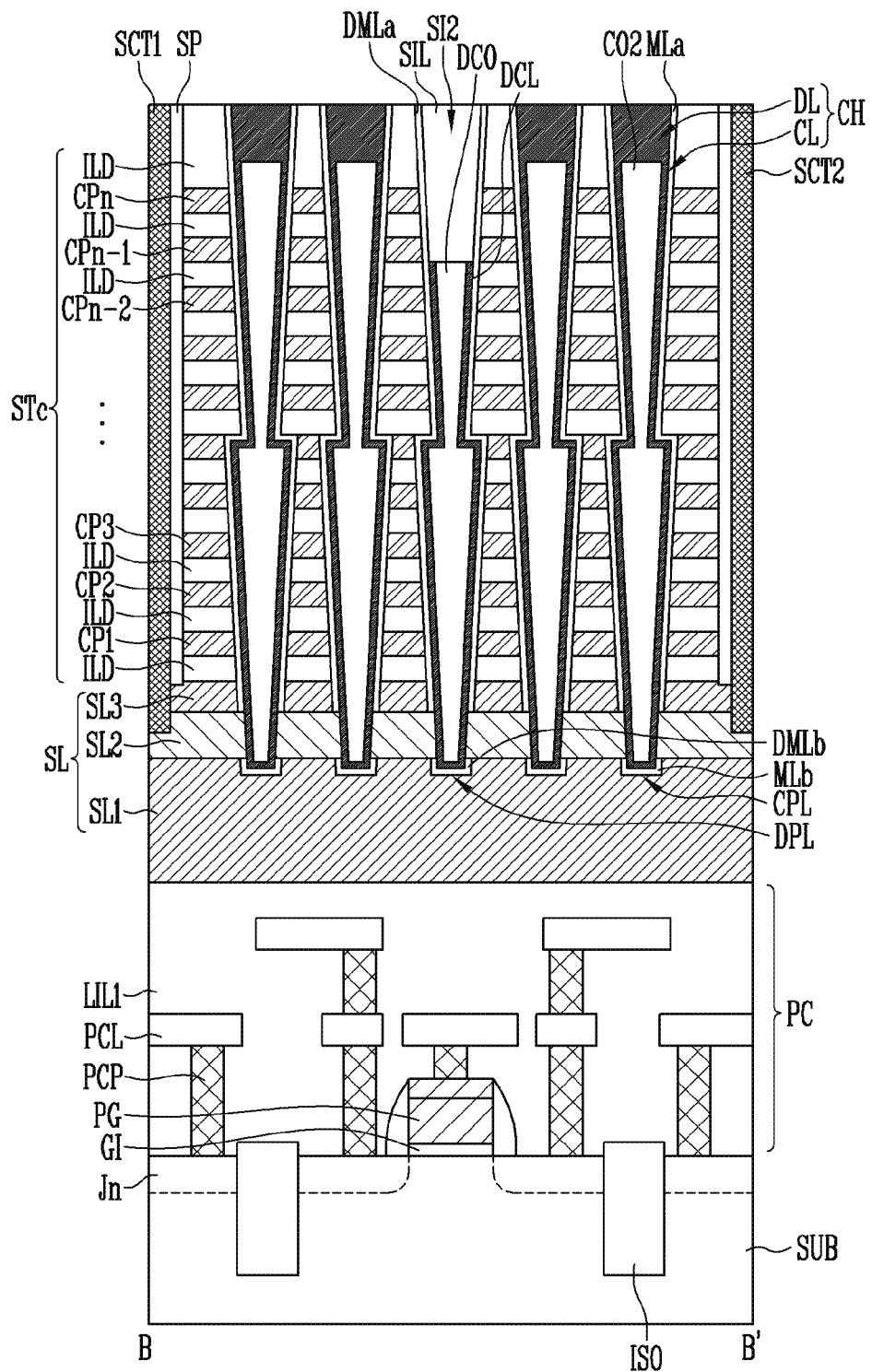

FIGS. 3A and 3B are sectional views of the semiconductor memory device taken along lines A-A' and B-B', respectively, shown in FIG. 2.

Referring to FIGS. 3A and 3B, the cell stack structure STc and the dummy stack structure STd may overlap a source structure SL and the peripheral circuit structure PC. The source structure SL may be disposed between a stack structure and the peripheral circuit structure PC. The stack structure includes the cell stack structure STc and the dummy stack structure STd.

Each of the vertical barrier VB, the cell plug CPL, and the dummy plug DPL may protrude farther than the cell stack structure STc and the dummy stack structure STd, and extend to the inside of the source structure SL.

The peripheral circuit structure PC may be disposed on the substrate SUB as described with reference to FIG. 1. The substrate SUB may include well regions doped with an n-type or p-type impurity, and each of the well regions of the substrate SUB may include active regions defined by an isolation layer ISO. The isolation layer ISO is formed of an insulating material.

The peripheral circuit structure PC may include peripheral gate electrodes PG, a gate insulating layer GI, junctions in, peripheral circuit lines PCL, and lower contact plugs PCP. The peripheral circuit structure PC may be covered with a first lower insulating layer LIL1.

The peripheral gate electrodes PG may be used as gate electrodes of NMOS and PMOS transistors. The gate insulating layer GI is disposed between each of the peripheral gate electrodes PG and the substrate SUB. The junctions in are regions defined by injecting an n-type or p-type impurity into an active region overlapped by each of the peripheral gate electrode PG, and are disposed at both sides of each of the peripheral gate electrodes PG. One of the junctions in disposed at both sides of each of the peripheral gate electrodes PG may be used as a source junction, and the other of the junctions in may be used as a drain junction. The peripheral circuit lines PCL may be electrically connected to a circuit for controlling a memory block through the lower contact plugs PCP. The circuit for controlling the memory block may include an NMOS transistor, a PMOS transistor, a resistor, a capacitor, and the like, as described with reference to FIG. 1. For example, the NMOS transistor may be connected to the peripheral circuit lines PCL through the lower contact plugs PCP.

The first lower insulating layer LIL1 may cover the peripheral circuit lines PCL and the lower contact plugs PCP. The first lower insulating layer LIL1 may include insulating layers stacked in a multi-layered structure.

The source structure SL may surround an end portion of each of the vertical barrier VB, the cell plug CPL, and the dummy plug DPL. The source structure SL may extend to be overlapped by the cell stack structure STc and the dummy stack structure STd. The source structure SL may be connected to source contact structures SCT1 and SCT2. The source contact structures SCT1 and SCT2 correspond to a conductive material disposed in the first slits SI1. The source contact structures SCT1 and SCT2 may include various conductive materials, such as a doped silicon layer, a metal layer, a metal silicide layer, and a barrier layer. The source contact structures SCT1 and SCT2 may include two or more kinds of conductive materials. For example, the source contact structures SCT1 and SCT2 may be formed in a stacking structure of a doped silicon layer in contact with the source structure SL and a metal layer formed on the doped silicon layer. The doped silicon layer may include an n-type dopant, and the metal layer may include a low-resistance metal, such as tungsten, so as to decrease the resistance thereof. FIGS. 3A and 3B illustrate first and second source contact structures SCT1 and SCT2 adjacent to each other.

Each of the first source contact structure SCT1 and the second source contact structure SCT2 may be insulated from the cell stack structure STc by a spacer insulating layer SP.

The source structure SL may be penetrated by a second lower insulating layer LIL2 disposed on the first lower insulating layer LIL1. The second lower insulating layer LIL2 is overlapped by the dummy stack structure STd. The cell stack structure STc and the dummy stack structure STd are disposed between the first source contact structure SCT1 and the second source contact structure SCT2.

The contact plug CTP penetrating the dummy stack structure STd may extend to penetrate the second lower insulating layer LIL2 and the first lower insulating layer LIL1, and be connected to any one of the peripheral circuit lines PCL. For example, the contact plug CTP may be connected to a peripheral circuit line PCL electrically connected to the NMOS transistor constituting a block select transistor. Embodiments of the present disclosure are not limited thereto. For example, the contact plug CTP may be in contact with a peripheral circuit line connected to the register, be in contact with a peripheral circuit line connected to the PMOS transistor, or be in contact with a peripheral circuit line connected to the capacitor.

The source structure SL may include first to third source layers SL1 to SL3 and a dummy source stack structure DS. Each of the first to third source layers SL1 to SL3 extend to be overlapped by the cell stack structure STc and the dummy stack structure STd. The second source layer SL2 is disposed between the first source layer SL1 and the cell stack structure STc, and the dummy source stack structure DS is disposed between the first source layer SL1 and the dummy stack structure STd. The dummy source stack structure DS and the second source layer SL2 may be disposed at the same height. The third source layer SL3 may be omitted in some cases.

Each of the first source layer SL1 and the second source layer SL2 may include a doped semiconductor layer. The doped semiconductor layer may include a source dopant. For example, the source dopant may be an n-type impurity. The third source layer SL3 may include at least one of a doped semiconductor layer and an undoped semiconductor layer. The third source layer SL3 may be penetrated by the source contact structures SCT1 and SCT2. The source contact structures SCT1 and SCT2 may extend from the second source layer SL2 (as shown) or extend from the first source layer SL1.

The vertical barrier VB, the cell plug CPL, and the dummy plug DPL may include the same material layer. The vertical barrier VB may include a semiconductor pattern SE, dielectric layers MLd and MLc surrounding the semiconductor pattern SE, and a first core insulating layer CO1 surrounded by the semiconductor pattern SE. The cell plug CPL may include a channel structure CH, dielectric layers MLa and MLb surrounding the channel structure CH, and a second core insulating layer CO2 surrounded by the channel structure CH.

The semiconductor pattern SE and the channel structure CH may be simultaneously formed, and be formed of the same material layer. The first core insulating layer CO1 and the second core insulating layer CO2 may be simultaneously formed, and be formed of the same material layer. Each of the semiconductor pattern SE and the channel structure CH may include a channel layer CL and a doped layer DL. The channel layer CL may be formed of a semiconductor layer. For example, the channel layer may be formed of a silicon layer. The channel layer CL may extend along an outer wall of the first core insulating layer CO1 or the second core insulating layer CO2, which corresponds thereto. The doped layer DL may overlap the first core insulating layer CO1 or the second core insulating layer CO2, which corresponds thereto. The doped layer DL may be connected to the channel layer corresponding thereto. The doped layer DL may be formed of a doped semiconductor layer. For example, the doped layer DL may be formed of an n-type doped silicon layer. The channel layer CL of the channel structure CH may be used as a channel region of a cell string, and the doped layer DL of the channel structure CH may be used as a drain junction of the cell string.

The dummy plug DPL may include a dummy channel structure DCL, dummy dielectric layers DMLa and DMLb surrounding the dummy channel layer DCL, and a dummy core insulating layer DCO surrounded by the dummy channel layer DCL. The dummy plug DPL may overlap with a separation insulating layer SIL. The separation insulating layer SIL may be disposed on the dummy core insulating layer DCO to fill the second slit SI2. The dummy channel layer DCL may be simultaneously formed with the channel layer CL, and be formed of the same material layer as the channel layer CL. The dummy core insulating layer DCO may be simultaneously formed with the first core insulating layer CO1 and the second core insulating layer CO2, and be formed of the same material layer as the first core insulating layer CO1 and the second core insulating layer CO2.

The dielectric layers MLc and MLd of the vertical barrier VB may include a dummy-side dielectric layer MLd and a cell-side dielectric layer MLc. Each of the dummy-side dielectric layer MLd and the cell-side dielectric layer MLc extends along an outer wall of the semiconductor pattern SE. The dummy-side dielectric layer MLd is disposed between the semiconductor pattern SE and the dummy stack structure STd, and the cell-side dielectric layer MLc is disposed between the semiconductor pattern SE and the cell stack structure STc. The dummy-side dielectric layer MLd extends between the semiconductor pattern SE and each of the third source layer SL3, the dummy source stack structure DS, the second source layer SL2, and the first source layer SL1 of the source structure SL. The dummy-side dielectric layer MLd and the cell-side dielectric layer MLc may be separated from each other by the second source layer SL2 inserted into a groove GV of the vertical barrier VB. The groove GV may be formed in each of sidewalls of the vertical barrier VB, which face the first source contact structure SCT1 and the second source contact structure SCT2. The dummy source stack structure DS may be disposed between the second lower insulating layer LIL2 and the dummy-side dielectric layer MLd.

The dielectric layers MLa and MLb of the cell plug CPL may include a memory layer MLa and a first dummy layer MLb. Each of the memory layer MLa and the first dummy layer MLb extends along an outer wall of the channel structure CH. The memory layer MLa is disposed between the cell stack structure STc and the channel structure CH, and the first dummy layer MLb is disposed between the first source layer SL1 of the source structure SL and the channel structure CH. The memory layer MLa and the first dummy layer MLb are separated from each other by the second source layer SL2 of the source structure SL, which extends to be in contact with the channel structure CH.

The dummy dielectric layers DMLa and DMLb of the dummy plug DPL may include a second dummy layer DMLa and a third dummy layer DMLb. Each of the second dummy layer DMLa and the third dummy layer DMLb extends along an outer wall of the dummy channel layer DCL. The second dummy layer DMLa is disposed between the cell stack structure STc and the dummy channel layer DCL, and the third dummy layer DMLb is disposed between the first source layer SL1 of the source structure SL and the dummy channel layer DCL. The second dummy layer DMLa may extend to surround a sidewall of the separation insulating layer SIL. The second dummy layer DMLa and the third dummy layer DMLb may be separated from each other by the second source layer SL2 of the source structure SL, which extends to be in contact with the dummy channel layer DCL.

The above-described dielectric layers MLc, MLd, MLa, MLb, DMLa, and DMLb may be simultaneously formed. For some embodiments, the dielectric layers MLc, MLd, MLa, MLb, DMLa, and DMLb are formed of the same material layer.

The dummy stack structure STd may include a first stack structure STd1 and a second stack structure STd2 formed on the first stack structure STd1. Each of the first stack structure STd1 and the second stack structure STd2 may include dummy interlayer insulating layers ILD' and sacrificial insulating layers SC. The vertical barrier VB may be divided into a first part P1 formed on a sidewall of the first stack structure STd1 and a second part P2 formed on a sidewall of the second stack structure STd2. The first part P1 and the second part P2 may have different sectional areas at a height at which a boundary between the first stack structure STd1 and the second stack structure STd2 is disposed. In an embodiment, the sectional area of the first part P1 may be formed greater than the sectional area of the second part P2 at the height at which the boundary between the first stack structure STd1 and the second stack structure STd2 is disposed. For an embodiment, a width of the first part P1 of the vertical barrier VB is greater than a width of the second part P2 of the vertical barrier VB at a height at which a boundary between the first stack structure STd1 and the second stack structure STd2 is disposed.

The cell stack structure STc may include interlayer insulating layers ILD and conductive patterns CP1 to CPn, which are alternately stacked. The cell stack structure STc may be disposed at the same height as the dummy stack structure STd. The interlayer insulating layers IDL may be disposed at the same levels as the dummy interlayer insulating layers ILD, and the conductive patterns CP1 to CPn may be disposed at the same levels as the sacrificial insulating layers SC.

The interlayer insulating layers ILD and the dummy interlayer insulating layers ILD' may be formed of the same material, and be formed through the same process. The sacrificial insulating layers SC are formed of a material having an etching rate different from the etching rate of the interlayer insulating layers ILD and the dummy interlayer insulating layers ILD'. For example, the interlayer insulating layers ILD and the dummy interlayer insulating layers ILD' may include a silicon oxide, and the sacrificial insulating layers SC may include a silicon nitride.

Each of the conductive patterns CP1 to CPn may include various conductive materials such as a doped silicon layer, a metal layer, a metal silicide layer, and a barrier layer. Each of the conductive patterns CP1 to CPn may include two or more kinds of conductive materials. For example, each of the conductive patterns CP1 to CPn may include tungsten and a titanium nitride layer TiN surrounding the surface of the tungsten. The tungsten is a low-resistance metal, and may decrease resistance of the conductive patterns CP1 to CPn. The titanium nitride layer TiN is a barrier layer, and may prevent direct contact between the tungsten and the interlayer insulating layers ILD.

The conductive patterns CP1 to CPn may be used as gate electrodes of a cell string. The gate electrodes of the cell string may include source select lines, word lines, and drain select lines. The source select lines are used as gate electrodes of source select transistors, the drain select lines are used as gate electrodes of drain select transistors, and the word lines are used as gate electrode of memory cells.

For example, a first conductive pattern CP1 disposed closest to the source structure SL among the conductive patterns CP1 to CPn may be used as a source select line. An nth conductive pattern CPn disposed most distant from the source structure SL among the conductive patterns CP1 to CPn may be used as a drain select line. Other embodiments, however, are not so limited. For example, each of one or more conductive patterns continuously stacked adjacent to the first conductive pattern CP1 among second conductive pattern CP2 to an (n−1)th conductive pattern CPn−1 between the first conductive pattern CP1 and the nth conductive pattern CPn may be used as another source select line. In addition, each of one or more conductive patterns continuously stacked adjacent to the nth conductive pattern CPn among the second conductive pattern CP2 to the (n−1)th conductive pattern CPn−1 may be used as another drain select line. The second slit SI2 and the separation insulating layer SIL may be separated into a drain select line of a first group and a drain select line of a second group, which can individually control conductive patterns (e.g., CPn and CPn−1) used as the drain select lines.

Conductive patterns disposed between the source select lines and the drain select lines among the conductive patterns CP1 to CPn may be used as the word lines.

Figure 4:
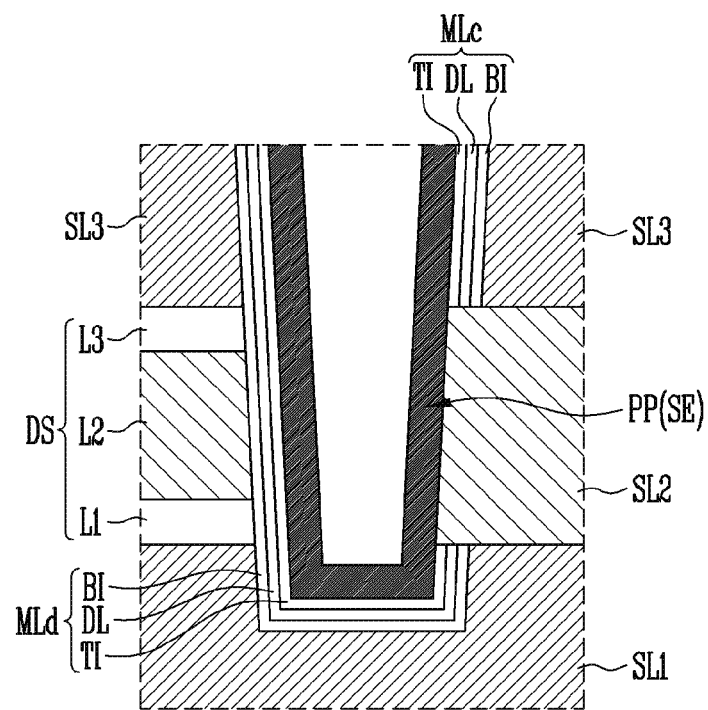
FIG. 4 is an enlarged view of region X shown in FIG. 3A.

FIG. 4 is an enlarged view of region X shown in FIG. 3A. The region X includes a protrusion part PP of the semiconductor pattern SE shown in FIG. 3A.

Referring to FIG. 4, the protrusion part PP is a portion of the semiconductor pattern SE, which protrudes farther toward a bottom of the vertical barrier VB than the cell stack structure STc and the dummy stack structure STd, which are shown in FIG. 3A. The protrusion part PP may be defined as a portion of the semiconductor pattern SE extending to the inside of the source structure SL.

Each of the first source layer SL1 and the third source layer SL3 of the source structure SL may be formed to surround the protrusion part PP. The source structure SL is spaced apart from the protrusion part PP by the dummy-side dielectric layer MLd. That is, the dummy-side dielectric layer MLd extends between the protrusion part PP and the source structure SL. The dummy-side dielectric layer MLd is spaced apart from the cell-side dielectric layer MLc by the second source layer SL2 of the source structure SL. The cell-side dielectric layer MLc may extend between the third source layer SL3 and the protrusion part PP. The second source layer SL2 disposed between the dummy-side dielectric layer MLd and the cell-side dielectric layer MLc is in direct contact with the protrusion part PP.

The dummy source stack structure DS spaced apart from the protrusion part PP by the dummy-side dielectric layer MLd may include at least one protective layer and at least one sacrificial source layer. For example, the dummy source stack structure DS may include a first protective layer L1, a sacrificial source layer L2, and a second protective layer L3, which are stacked between the first source layer SL1 and the third source layer SL3. The first protective layer L1 and the second protective layer L3 may be formed of a material having an etching rate different from the etching rate of the sacrificial source layer L2. For example, the first protective layer L1 and a second protective layer L3 may include an oxide, and the sacrificial source layer L2 may include a silicon layer.

Each of the dummy-side dielectric layer MLd and the cell-side dielectric layer MLc may include a tunnel insulating layer TI, a data storage layer DA, and a blocking insulating layer BI, which are sequentially stacked on a surface of the semiconductor pattern SE.

Figure 5:
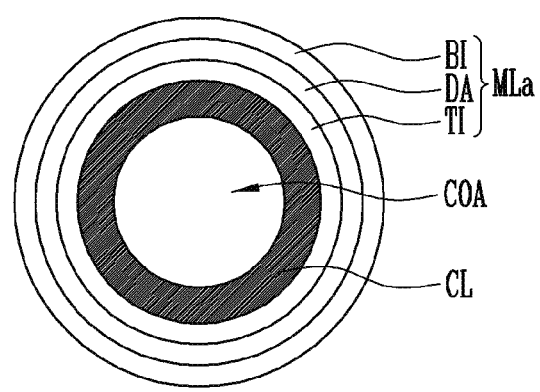
FIG. 5 is a view illustrating a cross section of a cell plug shown in FIG. 3B.

FIG. 5 is a view illustrating a cross section of the cell plug CPL shown in FIG. 3B.

Referring to FIG. 5, the channel layer CL of the cell plug CPL may be formed in a ring shape defining a core region COA. The core region COA may be filled with the doped layer DL described with reference to FIG. 3B, or be filled with the second core insulating layer CO2 described with reference to FIG. 3B. The memory layer MLa of the cell plug CPL may include a tunnel insulating layer TI, a data storage layer DA, and a blocking insulating layer BI, which are sequentially stacked on a surface of the channel layer CL.

The data storage layer DA shown in FIGS. 4 and 5 may be formed of a material layer capable of storing data changed using Fowler-Nordheim tunneling. To this end, the data storage layer DA may be formed of various materials. For example, the data storage layer DA may be formed of a nitride layer in which charges can be trapped. Other embodiments, however, are not so limited, and the data storage layer DA may include silicon, a phase change material, nano dots, and the like. The blocking insulating layer BI shown in FIGS. 4 and 5 may include an oxide layer capable of blocking charges. The tunnel insulating layer TI shown in FIGS. 4 and 5 may be formed of a silicon oxide layer through which charges can tunnel.

Figure 6A:
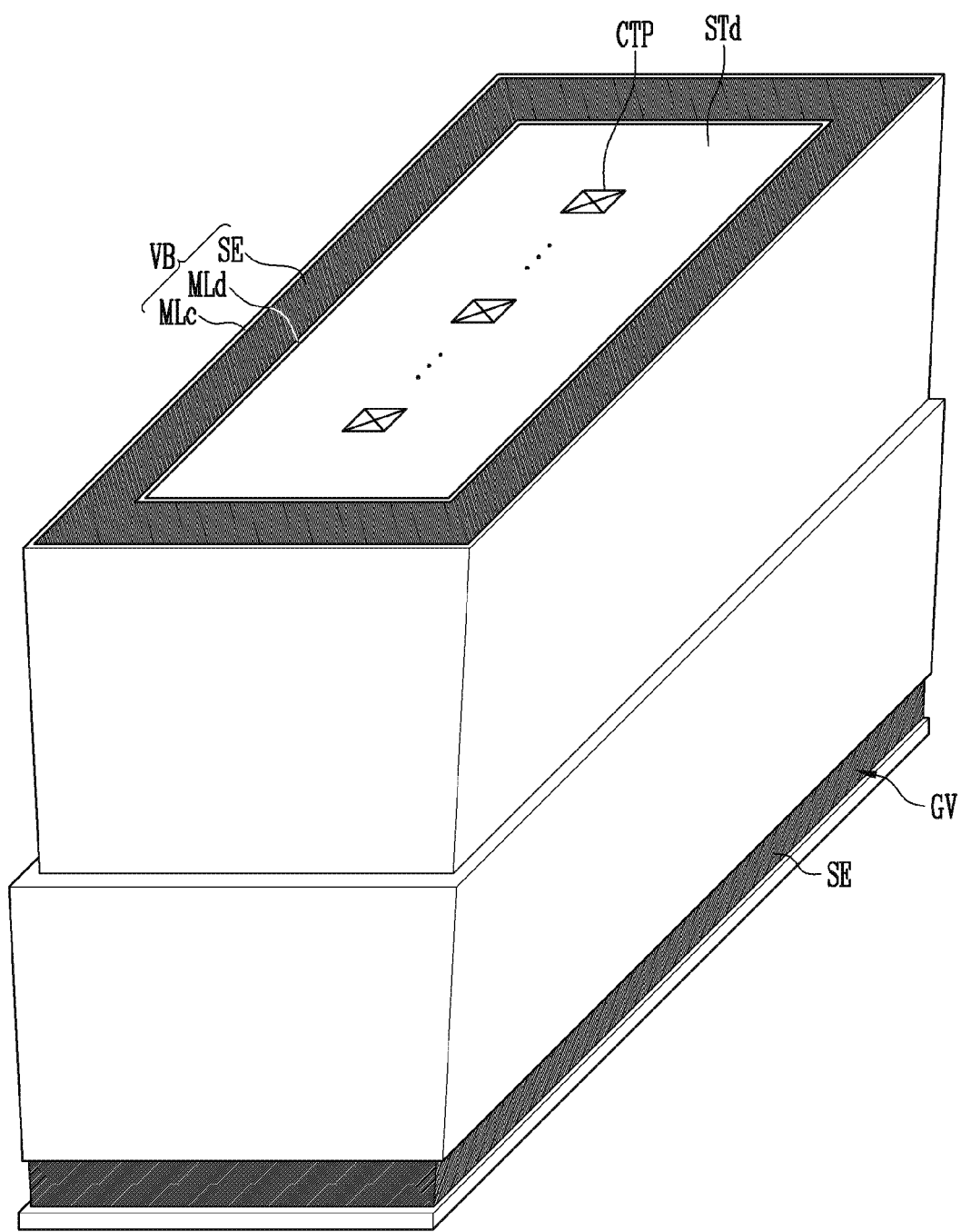
FIGS. 6A to 6C are views illustrating a vertical barrier shown in FIG. 2.
Figure 6B:
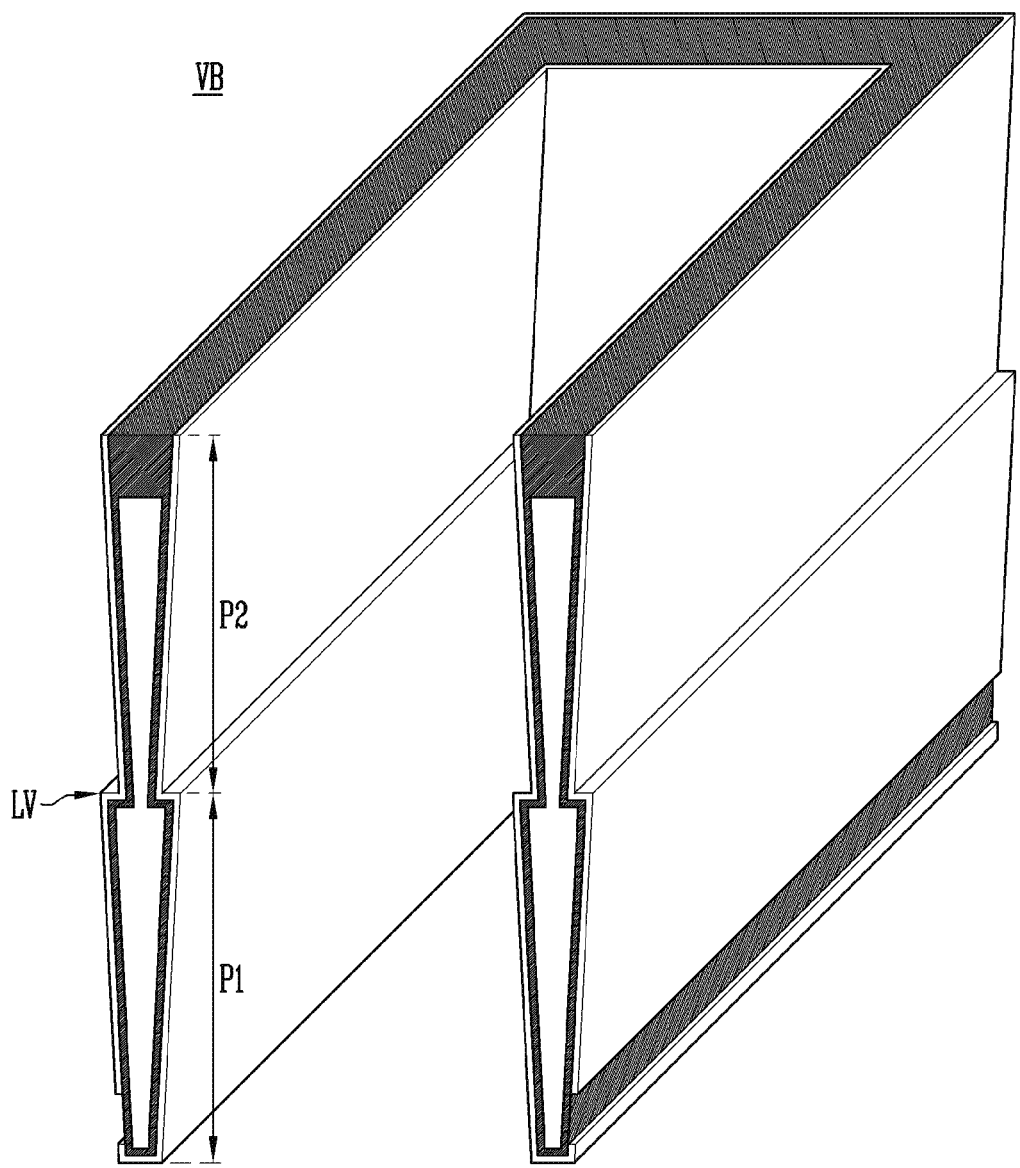
Figure 6C:
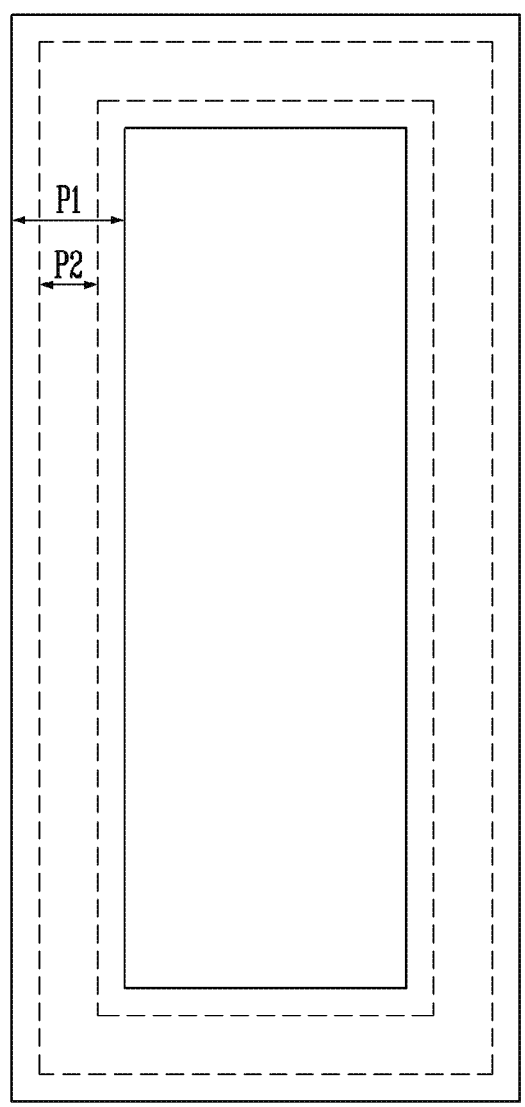

FIGS. 6A to 6C are views illustrating the vertical barrier VB shown in FIG. 2. FIG. 6A illustrates an appearance of the vertical barrier VB. FIG. 6B illustrates a longitudinal section of the vertical barrier VB and an inner wall of the vertical barrier VB. FIG. 6C illustrates a layout of a first part P1 and a second part P2, which are shown in FIG. 6B, at a boundary LV between the first part P1 and the second part P2.

Referring to FIG. 6A, the vertical barrier VB may extend along a sidewall of the dummy stack structure STd penetrated by the contact plug CTP, and include a groove GV exposing the semiconductor layer SE of the vertical barrier VB. The groove GV may extend along an outer wall of the vertical barrier VB.

The dummy-side dielectric layer MLd of the vertical barrier VB may extend to surround the sidewall of the dummy-side dielectric layer MLd. The cell-side dielectric layer MLc may extend to surround the semiconductor pattern SE while being opposite to the dummy-side dielectric layer MLd.

Referring to FIG. 6B, the vertical barrier VB may include the first part P1 and the second part P2. The boundary LV between the first part P1 and the second part P2 is defined at the same height as the boundary between the first stack structure STd1 and the second stack structure STd2, which are shown in FIG. 3A. A longitudinal section of each of the first part P1 and the second part P2 may have a tapered shape.

Sections of the first part P1 and the second part P2 at the boundary LV between the first part P1 and the second part P2 are as shown in FIG. 6C. Referring to FIG. 6C, the sectional area of the first part P1 may be formed greater than the sectional area of the second part P2. For an embodiment, a width of the first part P1 of the vertical barrier VB is greater than a width of the second part P2 of the vertical barrier VB at a height at which a boundary between the first stack structure STd1 and the second stack structure STd2 is disposed.

Figure 7A:
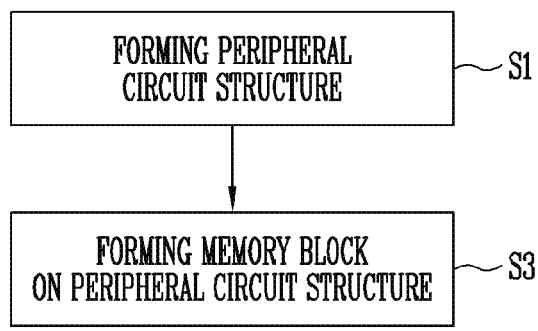
FIGS. 7A and 7B are flowcharts schematically illustrating manufacturing methods of the semiconductor memory device in accordance with embodiments of the present disclosure.
Figure 7B:
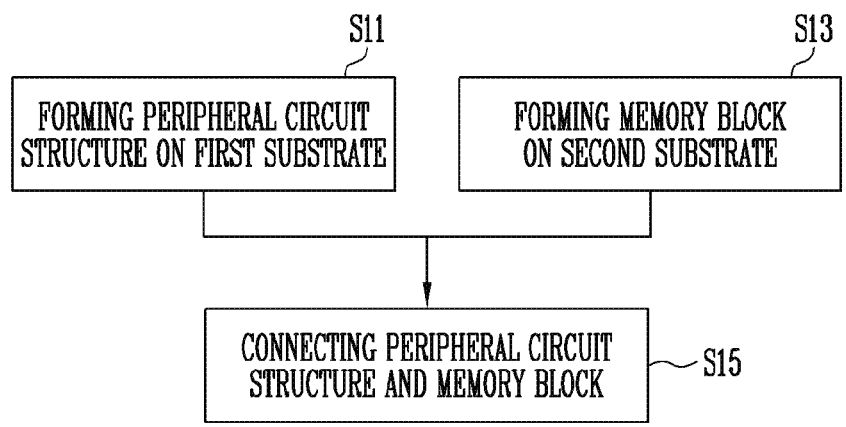

FIGS. 7A and 7B are flowcharts schematically illustrating manufacturing methods of the semiconductor memory device in accordance with embodiments of the present disclosure.

Referring to FIG. 7A, a manufacturing method of the semiconductor memory device in accordance with an embodiment of the present disclosure may include step S1 of forming a peripheral circuit structure on a substrate and step S3 of forming a memory block on the peripheral circuit structure.

The substrate provided in the step S1 may be the substrate SUB described with reference to FIGS. 3A and 3B. The peripheral circuit structure formed in the step S1 may be the peripheral circuit structure PC described with reference to FIGS. 3A and 3B.

The memory block formed in the step S3 may include the source structure SL, the cell stack structure STc, and the dummy stack structure STd, which are described with reference to FIGS. 3A and 3B.

Referring to FIG. 7B, a manufacturing method of the semiconductor memory device in accordance with an embodiment of the present disclosure may include step S11 of forming a peripheral circuit structure on a first substrate, step S13 of forming a memory block on a second substrate, and step S15 of connecting the peripheral circuit structure and the memory block.

The first substrate provided in the step S11 may be substrate SUB described with reference to FIGS. 3A and 3B. The peripheral circuit structure formed in the step S11 may be the peripheral circuit structure PC described with reference to FIGS. 3A and 3B.

The memory block formed in the step S13 may include the source structure SL, the cell stack structure STc, and the dummy stack structure STd, which are described with reference to FIGS. 3A and 3B.

The step S15 is a process for connecting the peripheral circuit structure formed in the step S11 and the memory block formed in the step S13. In an embodiment, the step S15 may be performed such that pad parts included in the peripheral circuit structure and the pad parts included in the memory block are adhered to each other.

Figure 8A:
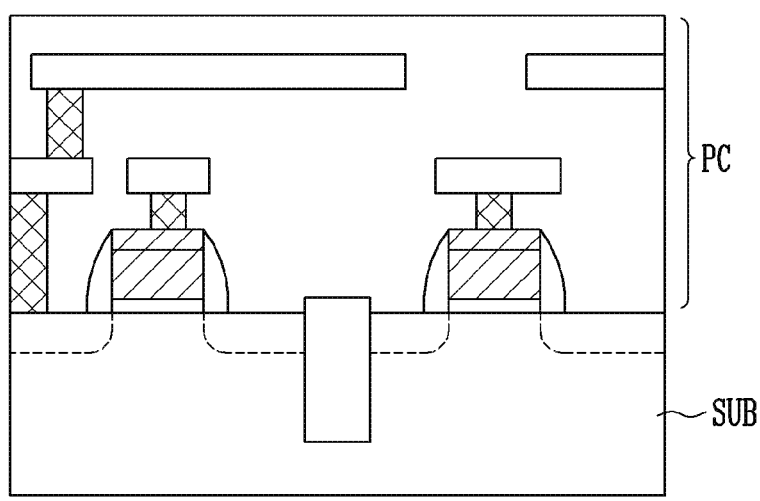
FIGS. 8A and 8B are views illustrating processes of providing a lower structure in accordance with embodiments of the present disclosure.
Figure 8B:
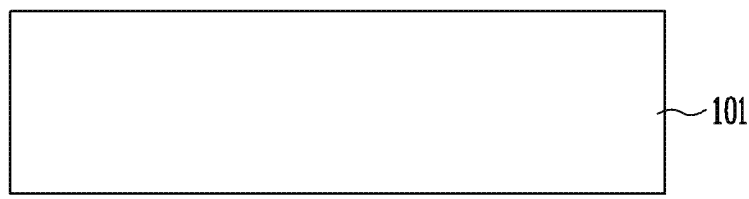

FIGS. 8A and 8B are views illustrating processes of providing a lower structure in accordance with embodiments of the present disclosure.

In accordance with the embodiment shown in FIG. 8A, the lower structure may be the substrate SUB on which the peripheral circuit structure PC is formed through the step S1 shown in FIG. 7A. A configuration of the substrate SUB and the peripheral circuit structure PC is identical to that described with reference to FIGS. 3A and 3B, therefore, its description is omitted here.

In accordance with the embodiment shown in FIG. 8B, the lower structure may be a second substrate 101 provided in the step S13 shown in FIG. 7B.

FIGS. 9A to 9G are sectional views illustrating processes of forming a memory block of the semiconductor memory device in accordance with an embodiment of the present disclosure. The processes shown in FIGS. 9A to 9G may be performed such that a memory block is formed on the lower structure shown in FIG. 8A or 8B.

Figure 9A:
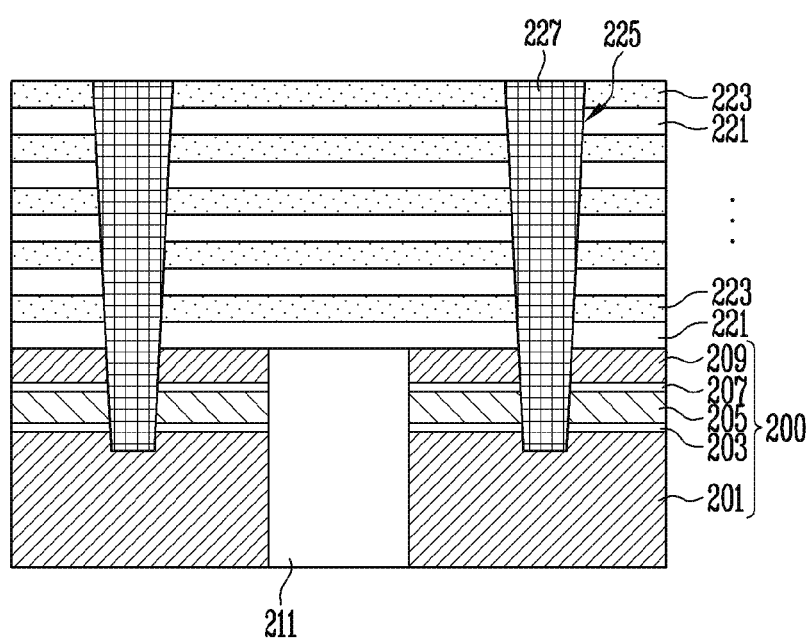
FIGS. 9A to 9G are sectional views illustrating processes of forming a memory block of the semiconductor memory device in accordance with an embodiment of the present disclosure.

Referring to FIG. 9A, a source stack structure 200 is formed on the peripheral circuit structure PC shown in FIG. 8A or the second substrate 101 shown in FIG. 8B. The source stack structure 200 may include a first doped semiconductor layer 201, a first protective layer 203, a sacrificial source layer 205, a second protective layer 207, and an etch stop layer 209, which are sequentially stacked.

The first doped semiconductor layer 201 may constitute the first source layer SL1 described with reference to FIGS. 3A and 3B. The first doped semiconductor layer 201 may include a doped silicon layer. The first doped semiconductor layer 201 may include a source dopant. For example, the source dopant may be an n-type impurity.

The first protective layer 203, the sacrificial source layer 205, and the second protective layer 207 may constitute the dummy source stack structure DS described with reference to FIGS. 3A and 4. The first protective layer 203 and the second protective layer 207 may be formed of a material having an etching rate different from the etching rates of the first doped semiconductor layer 201, the sacrificial source layer 205, and the etch stop layer 209. For example, the first protective layer 203 and the second protective layer 207 may include an oxide layer. The sacrificial source layer 205 may be formed of a material having an etching rate different from the etching rates of the first doped semiconductor layer 201 and the etch stop layer 209. For example, the etch stop layer 209 may include undoped silicon.

The etch stop layer 209 may constitute the third source layer SL3 described with reference to FIGS. 3A and 3B. The etch stop layer 209 may be formed of a material having an etching rate different from the etching rates of first material layers 221 and second material layers 223, which are formed in a subsequent process. For example, the etch stop layer 209 may include a doped silicon layer including a source dopant.

Subsequently, a lower insulating layer 211 penetrating the source stack structure 200 may be formed. The lower insulating layer 211 may constitute the second lower insulating layer LIL2 described with reference to FIGS. 3A and 3B.

Subsequently, the first material layers 221 and the second material layers 223 are alternately stacked on the source stack structure 200. The first material layers 221 and the second material layers 223 extend to cover the lower insulating layer 211. The first material layers 221 may constitute the interlayer insulating layers ILD and the dummy interlayer insulating layers ILD', which are described with reference to FIGS. 3A and 3B. The second material layers 223 are formed of a material having an etching rate different from the etching rate of the first material layers 221. For example, the first material layers 221 may include a silicon oxide, and the second material layers 223 may include a silicon nitride. The second material layers 223 may constitute the sacrificial insulating layers SC described with reference to FIG. 3A. The second material layers 223 may constitute the sacrificial insulating layers SC described with reference to FIG. 3A. The first material layers 221 and the second material layers 223 may constitute the first stack structure STd1 of the dummy stack structure STd described with reference to FIG. 3A.

Subsequently, a first trench 225 is formed to penetrate the first material layers 221 and the second material layers 223. The first trench 225 may penetrate the etch stop layer 209, the second protective layer 207, the sacrificial source layer 205, and the first protective layer 203, and extend to the inside of the first doped semiconductor layer 201. The first trench 225 defines a region in which the first part P1 of the vertical barrier VB described with reference to FIGS. 3A and 6B is to be formed. A sidewall of the first trench 225 may be formed to be inclined, and the width of the first trench 225 may be narrowed as it is close to the first doped semiconductor layer 201. The stacking height of the first material layers 221 and the second material layers 223 is controlled to be lower than a desired height of a cell string. Thus, although the width of the first trench 225 is not excessively widened, the first doped semiconductor layer 201 can be opened by the bottom of the first trench 225.

The process of forming the first trench 225 may be simultaneously performed with a process of forming lower holes in the cell array region CAR shown in FIG. 2. The lower holes define regions in which the cell plugs CPL of the cell array region CAR shown in FIG. 2 are to be formed. In addition, while the first trench 225 and the lower holes are being formed, first dummy holes may be formed in the cell array region CAR shown in FIG. 2. The first dummy holes define regions in which the dummy plugs DPL of the cell array region CAR shown in FIG. 2 are to be formed.

Subsequently, a buried pattern 227 filling the first trench 225 may be formed. The buried pattern 227 is formed of a material having an etch selectivity with respect to the first and second material layers 221 and 223. For example, the buried pattern 227 may include a metal, a barrier metal, polysilicon, or the like. The buried pattern 227 may be formed of a single material, or formed of different kinds of materials. In the process of forming the buried pattern, the lower holes and the first dummy holes, which are formed in the cell array region CAR shown in FIG. 2, may be filled with cell buried patterns formed of the same material as the buried pattern 227.

Figure 9B:
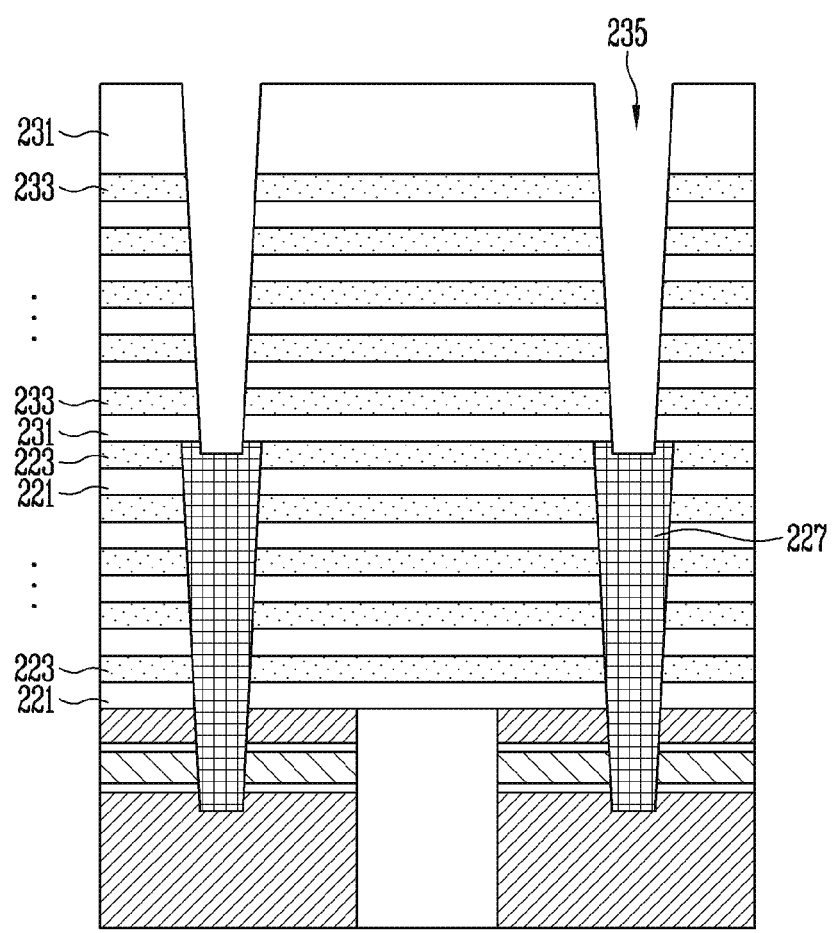

Referring to FIG. 9B, third material layers 231 and fourth material layers 233 are alternately stacked on the first material layers 221 and the second material layers 223, which are penetrated by the buried pattern 227. The third material layers 231 are formed of the same material as the first material layers 221 described with reference to FIG. 9A, and the fourth material layers 233 are formed of the same material as the second material layers 223 described with reference to FIG. 9A. The third material layers 231 may constitute the interlayer insulating layers ILD and the dummy interlayer insulating layers ILD, which are described with reference to FIGS. 3A and 3B. The fourth material layers 233 may constitute the sacrificial insulating layers SC described with reference to FIG. 3A. The third material layers 231 and the fourth material layers 233 may constitute the second stack structure STd2 of the dummy stack structure STd described with reference to FIG. 3A.

Subsequently, a second trench 235 penetrating the third material layers 231 and the fourth material layers 233 is formed. The second trench 235 is formed to expose the buried pattern 227. The second trench 235 defines a region in which the second part of the vertical barrier VB described with reference to FIGS. 3A and 6B is to be formed.

The process of forming the second trench 235 may be simultaneously performed with a process of forming upper holes in the cell array region CAR shown in FIG. 2. The upper holes define regions in which the cell plugs CPL of the cell array region CAR shown in FIG. 2 are to be formed. In addition, while the second trench 235 and the upper holes are being formed, second dummy holes may be formed in the cell array region CAR shown in FIG. 2. The second dummy holes define regions in which the dummy plugs DPL of the cell array region CAR shown in FIG. 2 are to be formed. Although not shown in the drawing, the upper holes and the second dummy holes may expose cell buried patterns formed in the cell array area CAR shown in FIG. 2.

A sidewall of the second trench 235 may be formed to be inclined, and the width of the second trench 235 may narrow with decreasing distance toward the buried pattern 227. The stacking height of the third material layers 231 and the fourth material layer 233 is controlled to be lower than a desired total height of a cell string. Thus, although the width of the second trench 235 is excessively widened, the buried pattern 227 can be opened by the bottom of the second trench 235.

Figure 9C:
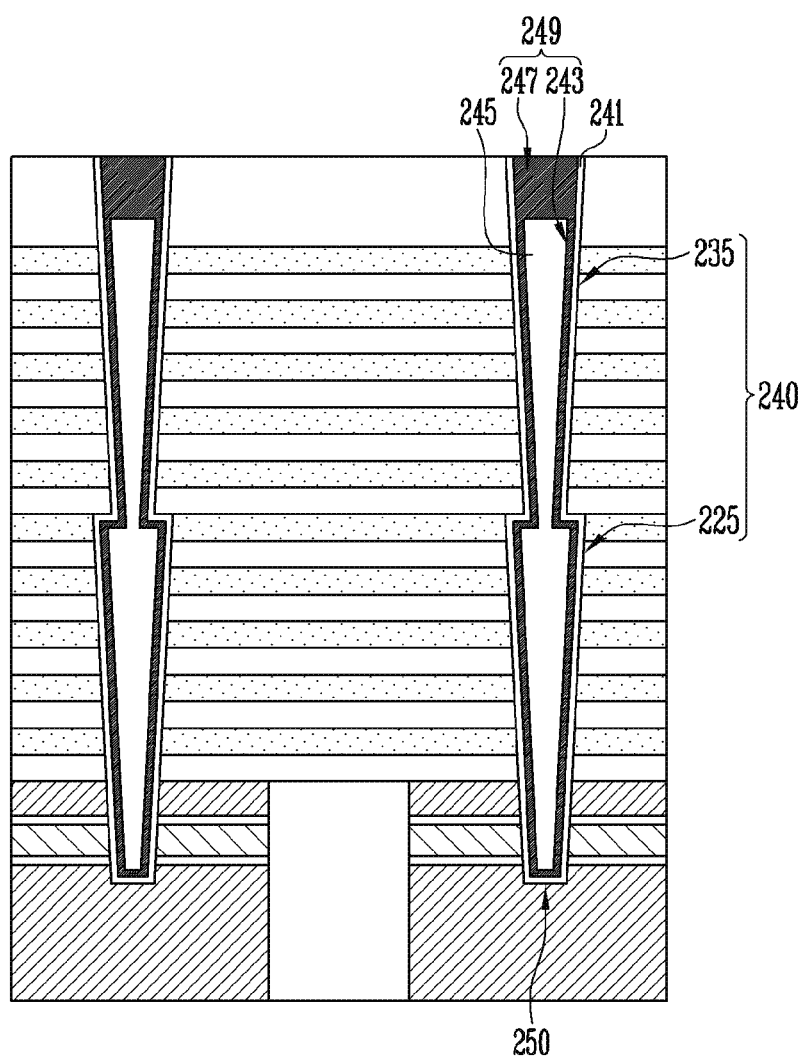

Referring to FIG. 9C, the first trench 225 may be opened by removing the buried pattern 227 shown in FIG. 9B through the second trench 235. Accordingly, an opening 240 including the first trench 225 and the second trench 235 is defined. While the buried pattern 227 is being removed, the cell buried patterns described with reference to FIG. 9A may be removed. Accordingly, the channel holes defining the regions in which the cell plugs CPL shown in FIG. 2 are to be disposed and the dummy holes defining the regions in which the dummy plugs DPL shown in FIG. 2 are to be disposed can be opened.

Subsequently, a vertical barrier 250 is formed in the opening 240. The process of forming the vertical barrier 250 may be formed using the process of forming the cell plugs CPL and the dummy plugs DPL in the cell array region CAR shown in FIG. 2. For example, the process of forming the vertical barrier 250 may include a process of forming a dielectric layer 241 on the surface of the opening 240 and a process of filling a central region of the opening 240, which is exposed by the dielectric layer 241, with a semiconductor pattern 249. The dielectric layer 241 may include a blocking insulating layer BI, a data storage layer DA, and a tunnel insulating layer TL as described with FIG. 4. The process of forming the semiconductor pattern 249 may include a process of forming a channel layer 243 on the surface of the dielectric layer 241 and a process of filling a central region of the opening 240, which is exposed by the channel layer 243, with a core insulating layer 245 and the doped layer 247. The channel layer 243 may include a silicon layer. The core insulating layer 245 may include an oxide. The doped layer 247 may include an n-type doped silicon layer.

Figure 9D:
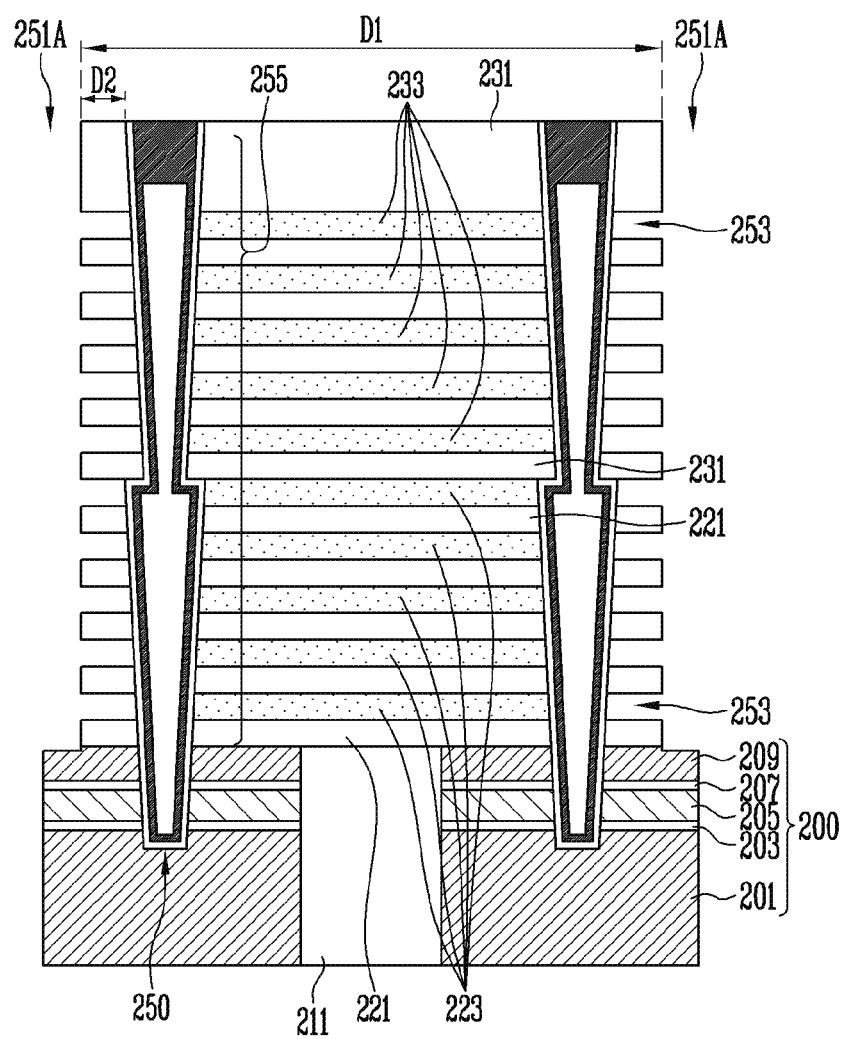

Referring to FIG. 9D, preliminary slits 251A penetrating the first to fourth material layers 221, 223, 231, and 233 are formed. The preliminary slits 251A may constitute a portion of the first slits SI1 shown in FIG. 2, and be formed in the same layout as the first slits SI1 shown in FIG. 2. The vertical barrier 250 may be disposed between adjacent preliminary slits 251A.

In accordance with some embodiments of the present disclosure, the vertical barrier 250 is formed in the opening 240 shown in FIG. 9C, which is formed through the process of forming the first trench 225 described with reference to FIG. 9A and the process of forming the second trench 235 described with reference to FIG. 9B. According to this process, as described with reference to FIG. 9B, although the width of the second trench 235 is not excessively widened, the vertical barrier 250 can be formed to a desired length.

A trench having a depth equal to the depth to which the vertical barrier 250 penetrates may be formed through a one-time etching process. An upper width of the trench in accordance with the comparison example is formed wider than that of the opening 240 shown in FIG. 9C in accordance with the present disclosure. Therefore, a separation distance between the preliminary slits is to be widely formed so as to secure a distance between each of the preliminary slits and the trench in accordance with the comparison example. The area occupied by a memory block may be increased. In accordance with an embodiment of the present disclosure, although a separation distance D1 between the preliminary slits 251A is narrowly formed as compared with the comparison example, a separation distance D2 between each of the preliminary slits 251A and the vertical barrier 250 can be secured. As a result, the area occupied by the memory block can be decreased as compared with the comparison example.

In an etching process for forming the preliminary slits 251A, the etch stop layer 209 having an etch resistance with respect to an etching material for etching the first to fourth material layers 221, 223, 231, and 233 may remain on the bottom of the preliminary slits 251A.

Subsequently, the second material layers 223 and the fourth material layers 233 are removed through the preliminary slits 251A. Accordingly, gate regions 253 are opened between first material layers 221 adjacent to each other in the stacking direction, between first and second material layers 221 and 231 adjacent to each other in the stacking direction, and between second material layers 231 adjacent to each other in the stacking direction between each of the preliminary slits 251A and the vertical barrier 250.

During an etching process for opening the gate regions 253, the vertical barrier 250 may block introduction of an etching material. Accordingly, the second material layers 223 and the fourth material layers 233, which are protected by the vertical barrier 250, remain to constitute a dummy stack structure 255. The dummy stack structure 255 includes the first to fourth material layers 221, 223, 231, and 233 overlapping the lower insulating layer 211. The vertical barrier 250 may serve as a support during the etching process for opening the gate regions 253.

Figure 9E:
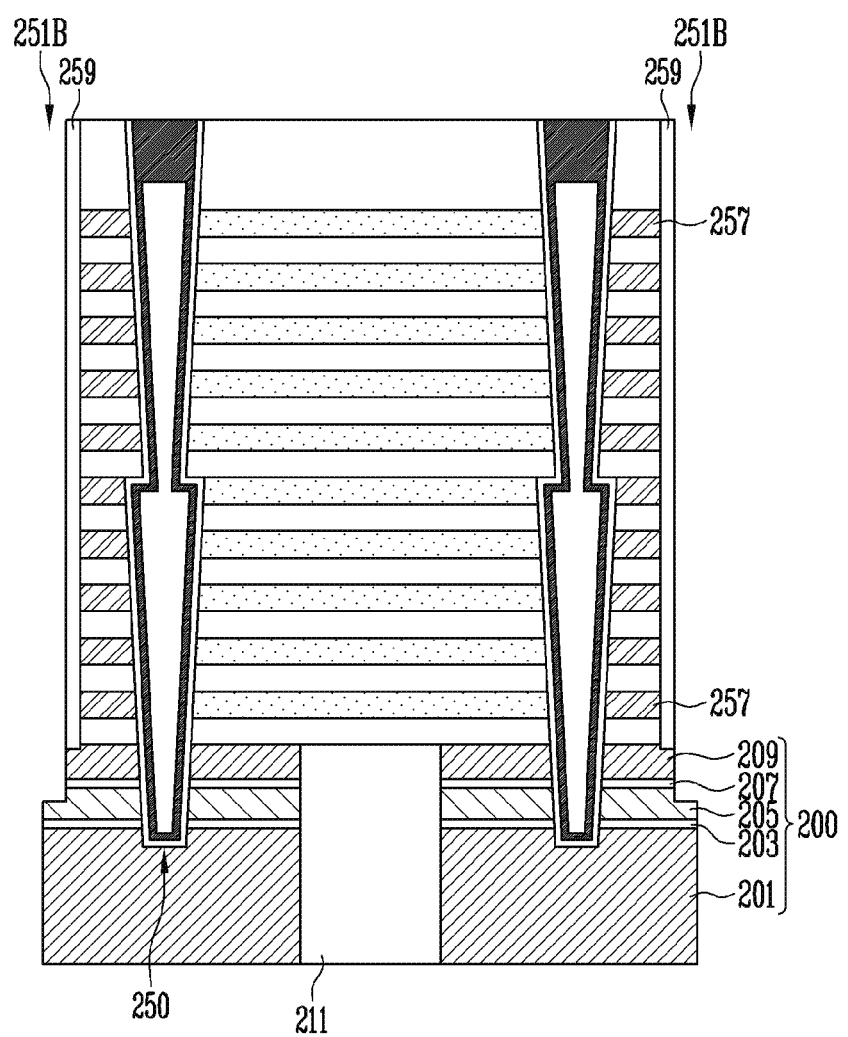

Referring to FIG. 9E, the gate regions 253 shown in FIG. 9C are filled with conductive patterns 257. The conductive patterns 257 may constitute the cell stack structure STc described with reference to FIGS. 3A and 3B.

The process of forming the conductive patterns 257 may include a process of introducing a conductive material through the preliminary slits 251A shown in FIG. 9D such that the gate regions 253 shown in FIG. 9D are filled and a process of removing a portion of the conductive material in the preliminary slits 251A shown in FIG. 9D such that the conductive material separated into the conductive patterns 257. The vertical barrier 250 may block the introduction of the conductive material.

Each of the conductive patterns 257 may include at least one of a doped silicon layer, a metal silicide layer, and a metal layer. Each of the conductive patterns 257 may include a low-resistance metal such as tungsten so as to achieve low-resistance wiring. Each of the conductive patterns 257 may further include a barrier layer such as a titanium nitride layer, a tungsten nitride layer, or a tantalum nitride layer.

Subsequently, a spacer insulating layer 259 may be formed on a sidewall of each of the preliminary slits 251A shown in FIG. 9D to cover sidewalls of the conductive patterns 257. Subsequently, the etch stop layer 209 and the second protective layer 207 are etched through the bottom of preliminary slits that are not covered with the spacer insulating layer 259. Accordingly, slits 251B are formed, which are integrated with the preliminary slits 251A shown in FIG. 9D and expose the sacrificial source layer 205.

Figure 9F:
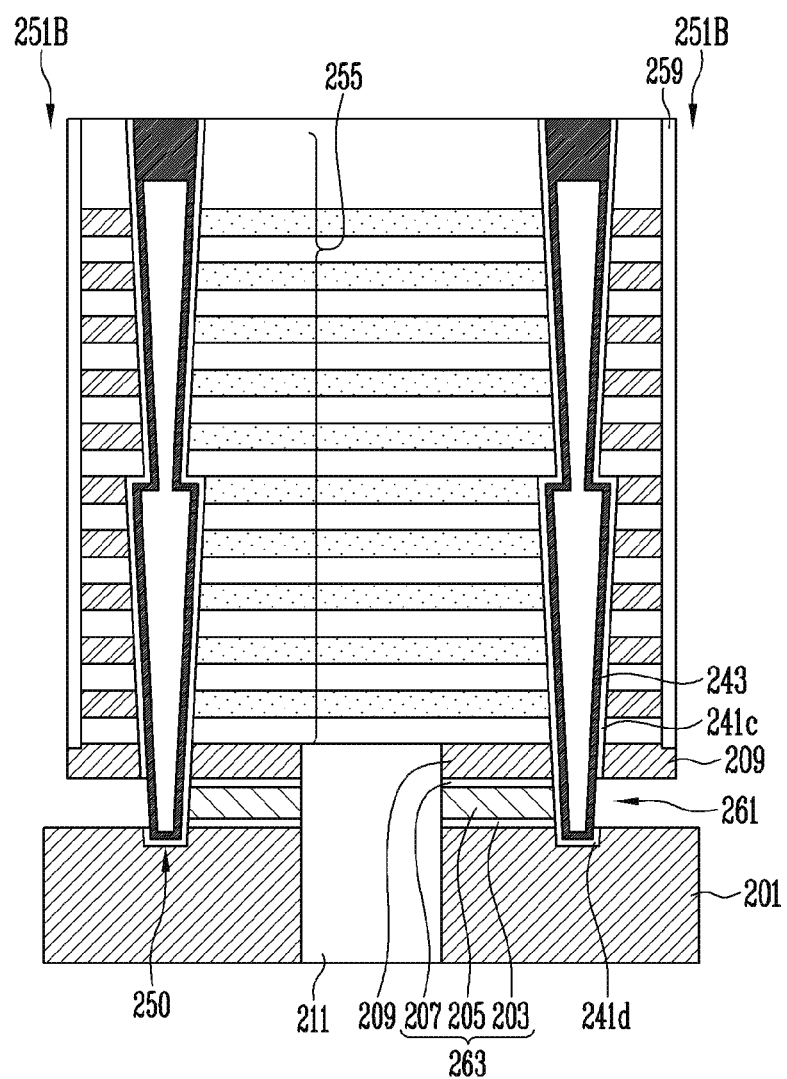

Referring to FIG. 9F, the dielectric layer is exposed by removing the sacrificial source layer 205 exposed through the slits 251B, and the exposed dielectric layer is removed. Accordingly, a source region 261 is opened between the first doped semiconductor layer 201 and the etch stop layer 209, which are adjacent to each of the slits 251B, and the dielectric layer is separated into a dummy-side dielectric layer 241d and a cell-side dielectric layer 241c by the source region 261. A sidewall of the channel layer 243, which faces each of the slits 251B, may be opened by the source region 261.

While the sacrificial source layer 205 is being removed, the first protective layer 203 and the second protective layer 207 may prevent loss of the first doped semiconductor layer 201 and the etch stop layer 209. The first protective layer 203 and the second protective layer 207 may be removed while the dielectric layer is being removed. The vertical barrier 250 may protect a portion of each of the sacrificial source layer 205, the first protective layer 203, and the second protective layer 207, which are overlapped by the dummy stack structure 255, from the etching process. Accordingly, the sacrificial source layer 205, the first protective layer 203, and the second protective layer 207, which are overlapped by the dummy stack structure 255, remain as a dummy source stack structure 263.

Figure 9G:
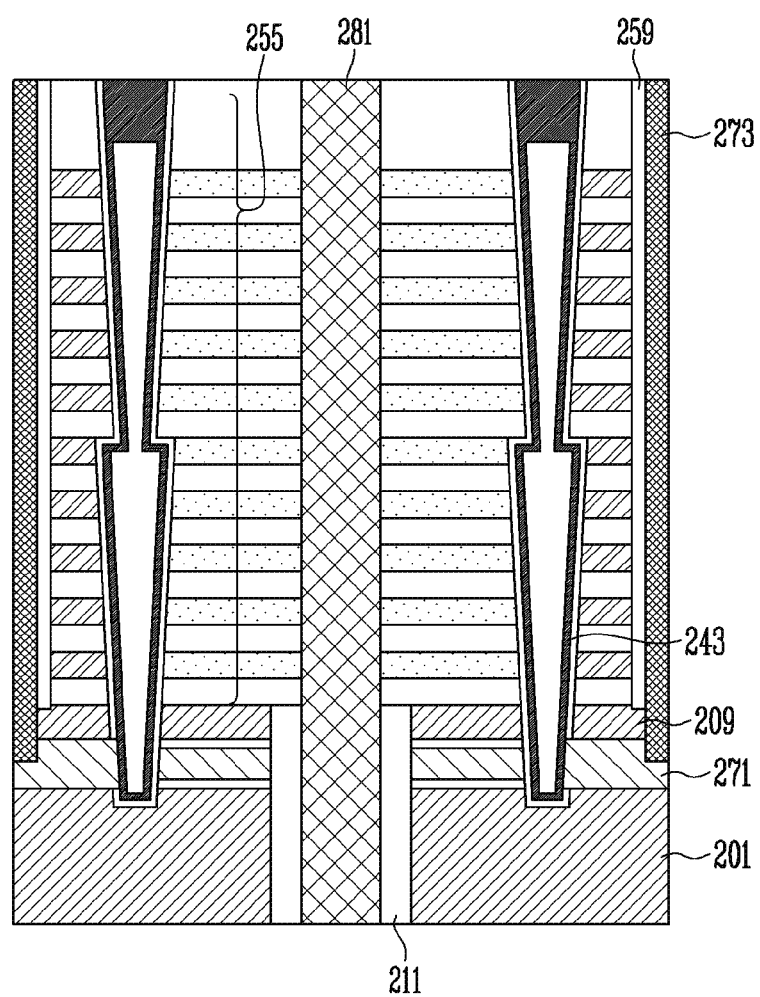

Referring to FIG. 9G, the source region 261 described with reference to FIG. 9F is filled with a second doped semiconductor layer 271. The second doped semiconductor layer 271 may be in contact with each of the channel layer 243, the first doped semiconductor layer 201, and the etch stop layer 209 remaining as a source layer. The second doped semiconductor layer 271 may be formed by using a chemical vapor deposition technique, or be formed by using a growth technique using, as a seed layer, each of the channel layer 243, the first doped semiconductor layer 201, and the etch stop layer 209 remaining as the source layer. The second doped semiconductor layer 271 may constitute the second source layer SL2 described with reference to FIGS. 3A and 3B.

Subsequently, each of the slits 251B described with reference to FIG. 9F may be filled with a source contact structure 273. The source contact structure 273 is formed on the spacer insulating layer 259, and is in contact with the second doped semiconductor layer 271. The source contact structure 273 is formed of a conductive material.

Subsequently, a contact plug 281 penetrating the dummy stack structure 255 and the lower insulating layer 211 may be formed. The contact plug 281 is formed of a conductive material.

Figure 10:
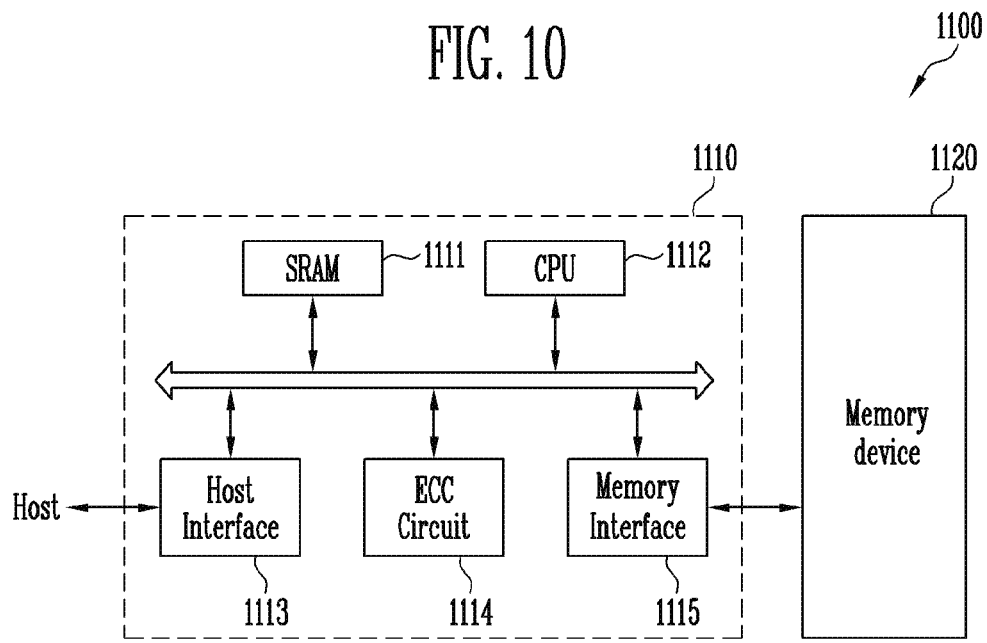
FIG. 10 is a block diagram illustrating a configuration of a memory system in accordance with an embodiment of the present disclosure.

FIG. 10 is a block diagram illustrating a configuration of a memory system 1100 in accordance with an embodiment of the present disclosure.

Referring to FIG. 10, the memory system 1100 includes a memory device 1120 and a memory controller 1110.

The memory device 1120 may be a multi-chip package configured with a plurality of flash memory chips. The memory device 1120 may include the cell stack structure, the dummy stack structure, and the vertical barrier, which are described with reference to FIGS. 2, 3A, 3B, 4, 5, and 6A to 6C.

The memory controller 1110 is configured to control the memory device 1120, and may include a static random access memory (SRAM) 1111, a CPU 1112, a host interface 1113, an error correction circuit (ECC Circuit) 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 11:
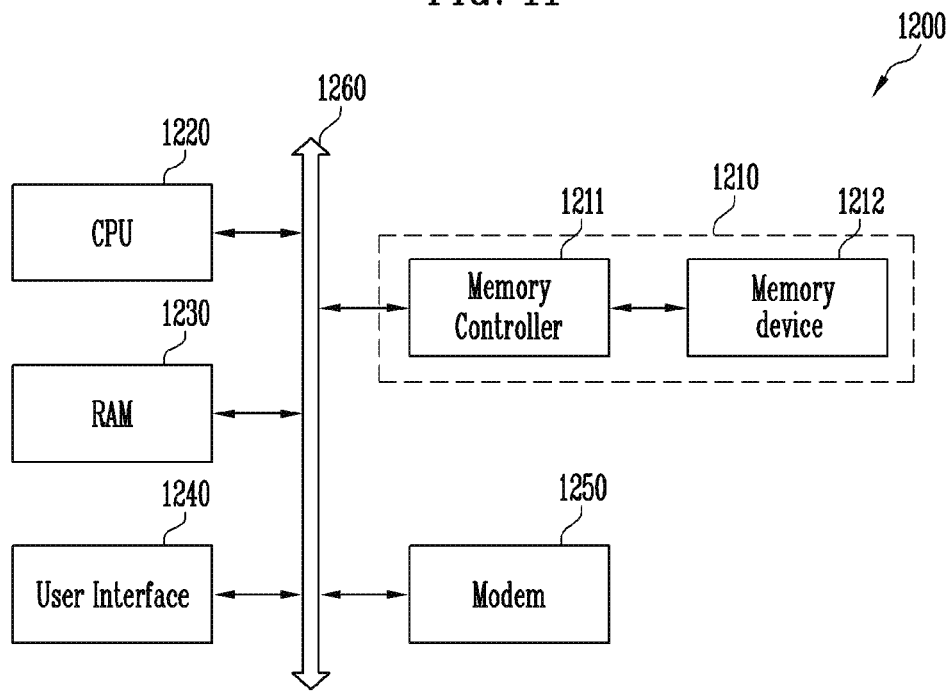
FIG. 11 is a block diagram illustrating a configuration of a computing system in accordance with an embodiment of the present disclosure.

FIG. 11 is a block diagram illustrating a configuration of a computing system 1200 in accordance with an embodiment of the present disclosure.

Referring to FIG. 11, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211.

In accordance with the present disclosure, a structure capable of serving as a support is disposed along the boundary between a dummy stack structure and a cell stack structure, so that the structural stability of a semiconductor memory device can be improved.

Presented embodiments of the present disclosure have been illustrated and described in the drawings and written description. Although specific terminologies are used here, they are used to explain the presented embodiments. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings commonly understood by those skilled in the art to which the present disclosure pertains. Terms having definitions as defined in a dictionary should be understood such that they have meanings consistent with the context of the related technique. So far as not being clearly defined in this application, terms should not be understood in an ideally or excessively formal way.

What is claimed is:

1. A semiconductor memory device comprising:
   a dummy stack structure including a first stack structure and a second stack structure formed on the first stack structure;
   a cell stack structure surrounding the dummy stack structure;
   a vertical barrier disposed at a boundary between the cell stack structure and the dummy stack structure, the vertical barrier including a first part formed on a sidewall of the first stack structure and a second part formed on a sidewall of the second stack structure; and
   a source structure disposed under the vertical barrier, and surrounding a protrusion part of a lower part of the vertical barrier,
   wherein a sectional area of the first part of the vertical barrier is greater than a sectional area of the second part of the vertical barrier at a height at which a boundary between the first stack structure and the second stack structure is disposed, and
   wherein the source structure includes:
   a source layer overlapped by the cell stack structure; and
   a dummy source stack structure overlapped by the dummy stack structure.

2. The semiconductor memory device of claim 1, wherein the vertical barrier comprises:
   a dummy-side dielectric layer extending to surround a sidewall of the dummy stack structure;
   a semiconductor pattern extending to surround the dummy-side dielectric layer; and
   a cell-side dielectric layer extending to surround the semiconductor pattern, wherein the cell-side dielectric layer is on an opposite side of the semiconductor pattern from the dummy-side dielectric layer.

3. The semiconductor memory device of claim 2, wherein the vertical barrier further includes a core insulating layer surrounded by the semiconductor pattern.

4. The semiconductor memory device of claim 2, wherein each of the dummy-side dielectric layer and the cell-side dielectric layer includes a tunnel insulating layer, a data storage layer, and a blocking insulating layer, which are sequentially stacked on a surface of the semiconductor pattern.

5. The semiconductor memory device of claim 2, wherein:
   the semiconductor pattern includes a protrusion part that protrudes farther toward a bottom of the vertical barrier than the cell stack structure and the dummy stack structure, and
   the protrusion part of the semiconductor pattern is surrounded by the source structure.

6. The semiconductor memory device of claim 5, further comprising:
   a lower insulating layer penetrating the source structure, the lower insulating layer overlapped by the dummy stack structure; and
   a contact plug extending to penetrate the dummy stack structure and the lower insulating layer.

7. The semiconductor memory device of claim 6, wherein the dummy-side dielectric layer is disposed between the source structure and the protrusion part of the semiconductor pattern, and is spaced apart from the cell-side dielectric layer.

8. The semiconductor memory device of claim 7, wherein:
   the source layer is overlapped by the cell stack structure, the source layer being in contact with the protrusion part of the semiconductor pattern between the dummy-side dielectric layer and the cell-side dielectric layer; and
   the dummy source stack structure is disposed between the lower insulating layer and the dummy-side dielectric layer at the same height as the source layer.

9. The semiconductor memory device of claim 1, further comprising:
   a channel structure penetrating the cell stack structure; and
   a memory layer disposed between the cell stack structure and the channel structure.

10. The semiconductor memory device of claim 1, wherein the cell stack structure includes interlayer insulating layers and conductive patterns, which are alternately stacked, wherein each of the first stack structure and the second stack structure of the dummy stack structure includes dummy interlayer insulating layers and sacrificial insulating layers, which are alternately stacked.

11. A semiconductor memory device comprising:
a source structure;
a first source contact structure and a second source contact structure, each extending from the source structure;
a dummy stack structure disposed between the first source contact structure and the second source contact structure;
a cell stack structure surrounding the dummy stack structure between the first source contact structure and the second source contact structure, the cell stack structure overlapping the source structure;
a semiconductor pattern extending along a boundary between the dummy stack structure and the cell stack structure, the semiconductor pattern extending to the inside of the source structure; and
dielectric layers extending along an outer wall of the semiconductor pattern, the dielectric layers separated from each other by the source structure,
wherein the source structure extends to be in contact with sidewalls of the semiconductor pattern, which face the first source contact structure and the second source contact structure.

12. The semiconductor memory device of claim 11, wherein the dielectric layers include:
a dummy-side dielectric layer disposed between the dummy stack structure and the semiconductor pattern; and
a cell-side dielectric layer disposed between the cell stack structure and the semiconductor pattern.

13. The semiconductor memory device of claim 12, wherein the dummy-side dielectric layer is disposed between the source structure and the semiconductor pattern.

14. The semiconductor memory device of claim 11, further comprising:
a lower insulating layer penetrating the source structure;
a peripheral circuit structure overlapped by the source structure and the lower insulating layer; and
a contact plug penetrating the dummy stack structure and the lower insulating layer, the contact plug connected to the peripheral circuit structure.

15. The semiconductor memory device of claim 11, wherein the dummy stack structure includes dummy interlayer insulating layers and sacrificial insulating layers, which are alternately stacked, and
the cell stack structure includes interlayer insulating layers and conductive patterns, which are alternately stacked.

16. The semiconductor memory device of claim 11, wherein each of the dielectric layers includes a tunnel insulating layer, a data storage layer, and a blocking insulating layer, which are sequentially stacked on a surface of the semiconductor pattern.

17. The semiconductor memory device of claim 11, wherein the source structure includes:
a first source layer extending to be overlapped by the dummy stack structure and the cell stack structure;
a dummy source stack structure disposed between the dummy stack structure and the first source layer, the dummy source stack structure spaced apart from the semiconductor pattern; and
a second source layer disposed between the first source layer and the cell stack structure, the second source layer being in direct contact with the semiconductor pattern.

18. The semiconductor memory device of claim 17, wherein the dummy source stack structure includes at least one protective layer and at least one sacrificial source layer, which are stacked between the first source layer and the dummy stack structure.

* * * * *